United States Patent
Cho

(10) Patent No.: US 8,822,899 B2
(45) Date of Patent: Sep. 2, 2014

(54) IMAGE SENSOR SUPPORTING A BINNING OPERATION USING SWITCHES

(75) Inventor: Kwang Jun Cho, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 13/293,344

(22) Filed: Nov. 10, 2011

(65) Prior Publication Data

US 2012/0112040 A1    May 10, 2012

(30) Foreign Application Priority Data

Nov. 10, 2010 (KR) .......................... 10-2010-0111663

(51) Int. Cl.
   *H01L 27/146*      (2006.01)
   *G01J 1/44*      (2006.01)
   *H04N 5/347*      (2011.01)
   *H04N 5/374*      (2011.01)

(52) U.S. Cl.
   CPC ............. *H04N 5/3742* (2013.01); *H04N 5/347* (2013.01); *H01L 27/14609* (2013.01)
   USPC ............. 250/208.1; 250/214 SW; 250/214 R; 250/226

(58) Field of Classification Search
   CPC .............. H04N 3/155; G01J 1/44; G01J 3/36; H01J 40/14
   USPC ................. 250/208.1, 214 R, 214 A, 214 LS, 250/214 SW, 226; 348/241, 268, 272–283; 257/431, 440
   See application file for complete search history.

(56) References Cited

U.S. PATENT DOCUMENTS

| | | | | |
|---|---|---|---|---|
| 7,154,075 B2* | 12/2006 | Krymski | .................... | 250/208.1 |
| 7,319,218 B2* | 1/2008 | Krymski | .................... | 250/208.1 |
| 7,548,261 B2* | 6/2009 | Yang et al. | .................... | 348/241 |
| 7,573,037 B1* | 8/2009 | Kameshima et al. | .... | 250/370.09 |
| 8,546,737 B2* | 10/2013 | Tian et al. | .................. | 250/208.1 |
| 2007/0063128 A1 | 3/2007 | Krymski | | |
| 2010/0309351 A1* | 12/2010 | Smith et al. | .................. | 348/280 |

FOREIGN PATENT DOCUMENTS

| KR | 1020060101531 A | 9/2006 |
|---|---|---|
| KR | 1020090083817 A | 8/2009 |

* cited by examiner

*Primary Examiner* — Georgia Y Epps
*Assistant Examiner* — Carolynn A Moore
(74) *Attorney, Agent, or Firm* — William Park & Associates Ltd.

(57) ABSTRACT

There is provided an image sensor, including an input control unit configured to control signal paths between a plurality of pixels and a plurality of sampling units and supplying outputs from the plurality of pixels in row units to the plurality of sampling units during a normal operation, while supplying the outputs from the plurality of pixels by color, to the plurality of sampling units during a binning operation; and an output control unit configured to control signal paths between the plurality of sampling units and an amplification unit and sequentially supplying outputs from the plurality of sampling units to the amplification unit during the normal operation while simultaneously supplying the outputs from the plurality of sampling units to the amplification unit during the binning operation.

11 Claims, 4 Drawing Sheets

IMAGE SENSOR SUPPORTING A BINNING OPERATION USING SWITCHES

CROSS-REFERENCE TO RELATED APPLICATIONS

This application claims priority to Korean Patent Application No. 10-2010-0111663 filed on Nov. 10, 2010 in the Korean Intellectual Property Office, the disclosure of which is incorporated herein by reference in its entirety.

BACKGROUND OF THE INVENTION

1. Field of the Invention

The present invention relates generally to an image sensor, and more particularly to an image sensor supporting a binning operation.

2. Description of the Related Art

Image sensors convert an optical image signal into an electrical image signal and are widely used in various electronic products such as mobile phones, personal computer cameras, video cameras, digital cameras, etc.

The image sensors support binning in a preview mode, a HD format mode, etc. in order to support requirements of the modern electronic products such as a high resolution, a small pixel size, a high frame speed, etc. Binning allows charges from adjacent pixels to be combined for faster readout speeds and improved signal to noise ratios although the spatial resolution may be reduced.

Certain binning operations may include: averaging the pixel signals from pixels by splitting the capacitors included in the correlated double sampling devices (CDSs) into two or four; or storing and summing pixel signals by adding extra capacitors to the CDSs.

In the case of splitting capacitors included in the CDSs, image improvement through the summation of pixel signals is not possible, since the capacitances of capacitors included in respective CDSs are identical. In the case of storing and summing pixels signals by adding extra capacitors, image improvement may be possible, but this increases the overall size of an image sensor due to an increase in the capacitances of capacitors, because the increased capacitances of capacitors included in respective CDSs.

SUMMARY OF THE INVENTION

An aspect of the methods and embodiments described herein provides an image sensor having an improved image quality while having a minimized increase in a size thereof, according to a binning operation.

According to an aspect of presented embodiments, there is provided an image sensor, including: an input control unit configured to control signal paths between a plurality of pixels and a plurality of sampling units and supplying outputs from the plurality of pixels in row units to the plurality of sampling units during a normal operation, while supplying the outputs from the plurality of pixels by color, to the plurality of sampling units during a binning operation; and an output control unit configured to control signal paths between the plurality of sampling units and an amplification unit and sequentially supplying outputs from the plurality of sampling units to the amplification unit during the normal operation while simultaneously supplying the outputs from the plurality of sampling units to the amplification unit during the binning operation.

According to another aspect of the present invention, there is provided an image sensor, comprising: $N^2/2$, where N is a natural number equal to or greater than 2, first switches having both terminals connected to output terminals of two pixels located in adjacent columns; $N^2$ second switches connected between both terminals of the $N^2/2$ first switches and input terminals of $N^2$ sampling units; and $N^2$ third switches connected between output terminals of the $N^2$ sampling units and an input terminal of an amplifier; wherein all of the $N^2/2$ first switches and $N^2$ third switches are turned on and the $N^2$ second switches are alternately turned on in column units during analog binning; and all of the $N^2/2$ first switches are turned off, all of the $N^2$ second switches are turned on, and the $N^2$ third switches are turned on one at a time, during a normal operation.

Still another embodiment includes a method comprising configuring paths by an output control unit so that an amplification unit receives outputs from a plurality of pixels in row units during a normal operation, and the output control unit receives outputs from a plurality of pixels based on color during a binning operation. The method further comprising performing, at the amplification unit, a summation operation during the binning operation and a programmable-gain amplification during the normal operation.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
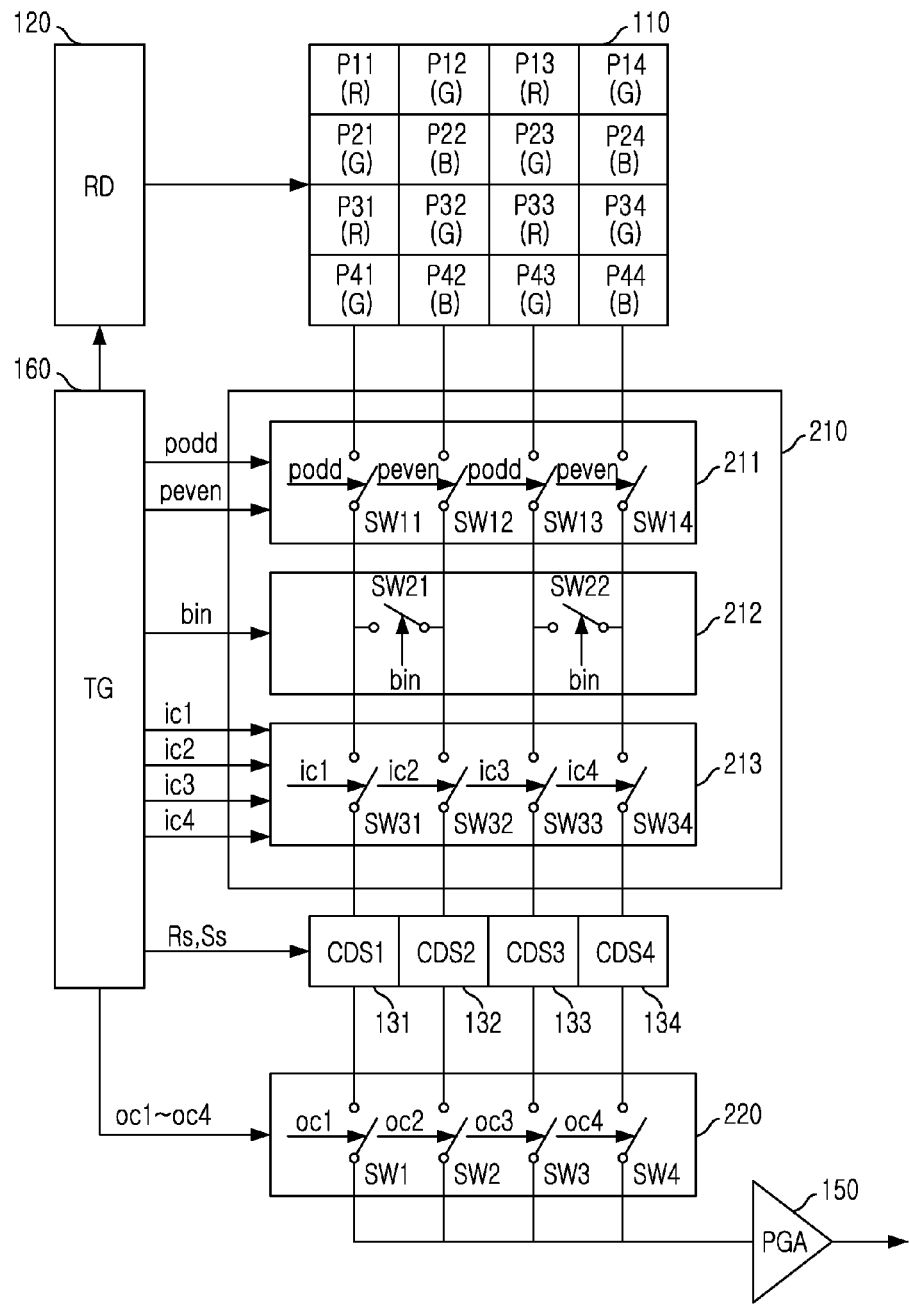
FIG. 1 is a configuration diagram of an image sensor according to an embodiment of the present invention.

Embodiments of the present invention will now be described in detail with reference to the accompanying drawings. There may be, however, other embodiments in many different forms and, therefore all possible embodiments should not be construed as being limited to the embodiments set forth herein.

In order to clearly describe the embodiments presented herein, elements unrelated to the description may be omitted in the drawings, and the same or equivalent elements will be referred to by the same reference numerals throughout the specification.

In addition, unless explicitly described to the contrary, the word "comprise" and variations such as "comprises" or "comprising," will be understood to imply the inclusion of stated elements but not the exclusion of any other elements.

Furthermore, for convenience of explanation, it is assumed that an image sensor according to some embodiments of the present invention receives an image having a Bayer pattern to be operated.

FIG. 1 is a configuration diagram of an image sensor according to an embodiment of the present invention.

Referring to FIG. 1, the image sensor includes, inter alia: a pixel array 110, a row decoder (RD) 120, a plurality of correlated double sampling devices or units (CDSs) 131~134, a programmable gain amplifier (PGA) 150, and a timer generator (TG) 160. In addition, the image sensor may also include, inter alia, a CDS input control unit 210 and a CDS output control unit 220 for controlling the signal paths between the pixel array 110 and the CDS 131~134 and the signal paths between the CDS 131~134 and the PGA 150 according to an operational mode of the image sensor.

In the pixel array 110, a plurality of pixels P11~P44 are arranged in a matrix form based on a Bayer pattern. Each of the pixels P11~P44 may generate and output a pixel signal having a signal value corresponding to the quantity of light incident thereon when an operation thereof is activated.

The RD 120 may select the pixels to be operationally activated among the plurality of pixels P11~P44. In particular, the RD 120 may select a row of pixels to be operationally activated, for example, P11, P12, P13, P14, and may select the pixels of a common color from the selected row unit, for example, P11 and P13, to be operationally activated.

The CDS input control unit 210 is operated such that the plurality of CDSs CDS1 131, CDS2 132, CDS3 133, CDS4 134 receive only the pixel signals having the same color information among a plurality of pixel signals during a binning operation and receive the plurality of pixel signals in the row units during a normal operation to perform the correlated-double sampling operations.

The CDS input control unit 210 may actively vary signal paths between the pixels P11~P44 and the CDSs 131~134 according to an operational mode of the image sensor. That is, when the image sensor is operated in a binning mode, the CDS input control unit 210 may control the signal paths between the pixels P11~P44 and the CDSs 131~134 to only allow pixel signals having the same color information, among a plurality of pixel signals, to be supplied to CDSs 131~134. If, however, the image sensor is operated in a normal mode, the CDS input control unit 210 may connect the pixels P11~P44 and the CDSs 131~134 to allow a plurality of pixel signals to be supplied to the CDSs 131~134 in row units.

The CDS input control unit 210 may include an adjacent column connection unit 212 that may connect pixels located in adjacent columns during the binning operation and release the pixel connection during the normal operation. The CDS input control unit 210 may also include a CDS input switching unit 213 that may use a switching mechanism to connect the pixels and CDS located in the same column, and the pixels and CDS located in adjacent columns during the binning operation. During normal operation, the CDS input switching unit 213 may connect the pixels and CDS in a same column.

The adjacent column connection unit 212 may be implemented as a plurality of second input switches SW21 and SW22 which are connected between the pixels located in adjacent columns. The plurality of second input switches SW21 and SW22 may be turned on during the binning operation and turned off during the normal operation.

The CDS input switching unit 213 may be implemented as a plurality of third input switches SW31~SW34 that may be connected to the plurality of pixels in column units at the rear end of the adjacent column connection unit 212. The third input switches SW31~SW34 may be repeatedly turned on and off in column units during the binning operation while being turned on during the normal operation.

For reference, since the plurality of pixels P11~P44 according to an embodiment of the present invention are arranged based on the Bayer pattern, pixel signals having the same color information may be generated and outputted by pixels located in alternate columns and rows (columns and rows adjacent to each other alternately). Pixel signals having the same color information and generated by the pixels located in alternate rows while being located in the same column may be transferred through the same column line.

Thus, the CDS input switching unit 213 according to an embodiment of the present invention may control the signal paths between the pixels and the CDSs 131~134 to allow the pixel signals having the same color information to be dispersely supplied to the CDSs 131~134.

The CDS input control unit 210 may further include a pixel switching unit 211 selectively supplying only pixel signals having the same color information among the plurality of pixel signals to the adjacent column connection unit 212 during the binning operation. During normal operation, however, the pixel switching unit 211 may supply the plurality of pixel signals, in row units, to the adjacent column connection unit 212.

In an embodiment, the pixel switching unit 211 may be implemented as a plurality of first input switches SW11~SW14 which are located in a front end of the adjacent column connection unit 212, and may be connected to the plurality of pixels in column units. The plurality of first input switches SW11~SW14 comprising the switching unit 211 may be repeatedly turned on and turned off in column units during the binning operation, and turned on during the normal operation.

The CDS output control unit 220 may be connected to output terminals of the plurality of CDSs 131~134 and actively vary the signal paths between the plurality of CDSs 131~134 and the PGA 150 according to the operational mode of the image sensor. That is, when the image sensor is operated in the binning mode, the CDS output control unit 220 may connect all of the CDSs 131~134 to the PGA 150. When, however, the image sensor is operated in the normal operation, the CDS output control unit 220 may connect only one of the CDSs 131~134 to the PGA 150.

The CDS output control unit 220 may be implemented as a plurality of output switches SW1~SW4 that may be connected to the output terminals of the CDSs 131~134, respectively. All of the output terminals of the CDSs 131~134 may be turned on during the binning operation. During normal operation, however, only one of the output terminals of the CDSs 131~134 is turned on.

The PGA 150 may simultaneously receive outputs from the plurality of CDSs 131~134 (that is, pixel signals having the same color information and correlated double sampling performed thereupon) through the CDS output control unit 220. The PGA 150 may perform a summation of the outputs received from the CDSs 131~134 (that is, binning), to thereby generate a final output. During normal operation, on the other hand, the PGA 150 may receive the outputs from the CDSs 131~134, one at a time, through the CDS output control unit 220. To generate a final output, the PGA 150 may perform programmable-gain amplification on the outputs received from the CDSs 131~134 through the CDS output control unit 220.

The TG 160 may generate a control signal for operationally controlling the RD 120 and the plurality of CDSs 131~134. The TG 160 may further generate control signals podd, peven, bin, ic1~ic4, and oc1~oc4 for supporting operations of the pixel switching unit 211, the adjacent column connection unit 212, the CDS input switching unit 213, and the CDS output control unit 220.

The control signals podd and peven may be control signals for operationally controlling the first input switches SW11~SW14. The control signal bin may be a control signal for operationally controlling the second input switches SW21 and SW22. The control signals ic1~ic4 may be control signals for operationally controlling the third input switches SW31~SW34. Further, the control signals oc1~oc4 may be control signals for operationally controlling the output switches SW1~SW4.

The image sensor according to an embodiment of the present invention may perform binning on $N^2$ pixels (N is a natural number, equal to or greater than 2) located in alternate columns and rows. This is because a distortion in a binning-completed image may be generated if the number of pixels located in a row unit and the number of pixels located by in a column unit are different, the pixels being subjected to binning.

Figure 2A:
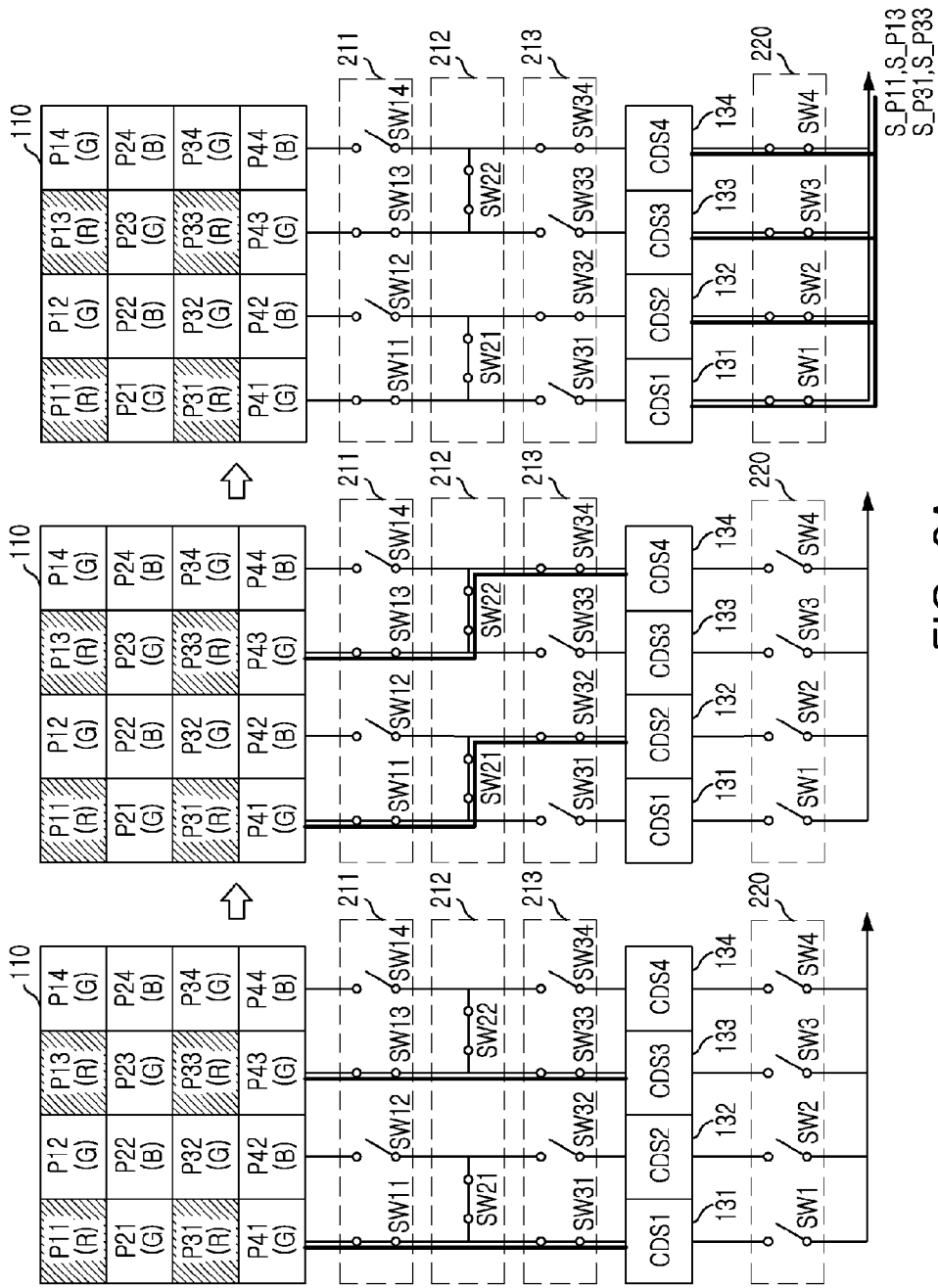
FIGS. 2A and 2B are diagrams for explaining a binning operation of the image sensor according to an embodiment of the present invention.
Figure 2B:
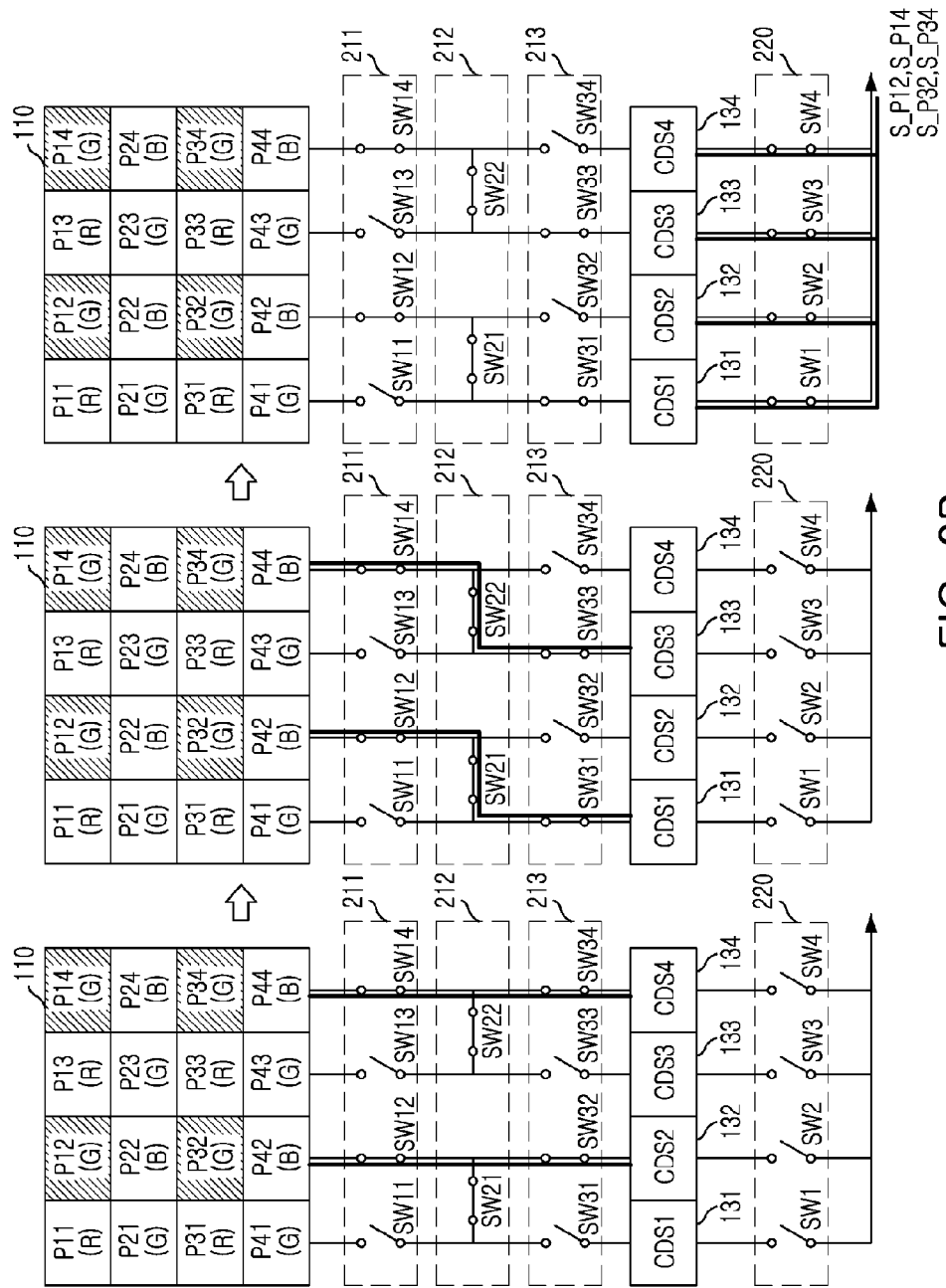

FIGS. 2A and 2B are diagrams for explaining a binning operation of the image sensor according to an embodiment of the present invention.

Hereinafter, for convenience of description, it is assumed that the image sensor may perform binning on four red pixels P11, P13, P31 and P33 and then further performs binning on four green pixels P12, P14, P32 and P34.

First, referring to FIG. 2A, a binning operation on four red pixels P11, P13, P31 and P33 will be explained.

In a first mode, the RD 120 may operationally activate pixels P11~P14 located in a first row of the pixel array 110. The CDS input control unit 210 may turn on the first input switches SW11 and SW13 in odd columns, the second input switches SW21 and SW22, and the third input switches SW31 and SW33 in the odd columns. Accordingly in the first mode, red pixel signals in the first row may pass through the turned-on switches SW11/SW21/SW31 and SW13/SW22/SW33 to be supplied to the CDS 131 and 133 located in odd columns. The CDS 131 and 133, which may be located in odd columns, may perform correlated double sampling on the red pixel signals to generate red sampling signals S_P11 and S_P13.

In a second mode, the RD 120 may activate all of pixels P31~P34 located in a third row. The CDS input control unit 210 may turn on the first input switches SW11 and SW13 in odd columns of pixel array 110, the second input switches SW21 and SW22, and the third input switches SW32 and SW34 in the even columns. That is, in order that pixel signals are supplied to the CDSs 132 and 134 which have not performed correlated double sampling in the previous process, the RD 120 may vary a part of the signal paths that the CDS input control unit 210 establishes between the pixels P11~P44 and the CDS 131~134. Accordingly in the second mode, red pixel signals in the third row may be supplied to the remaining CDS 132 and 134 which have not performed correlated double sampling in the first mode, through the turned-on switches SW11/SW21/SW32 and SW13/SW22/SW34, and in response to this, the CDS 132 and 134 may generate red sampling signals S_P31 and S_P33.

In a third mode, the CDS output control unit 220 may turn on all of the output switches SW1~SW4.

Accordingly, the red sampling signals S_P11, S_P13, S_P31, and S_P33 generated through the plurality of CDSs 131~134 may be simultaneously supplied to the PGA 150, and the PGA 150 may perform a summation of these signals (that is, binning) to thereby generate a final output signal.

When the binning operation on four red pixels P11, P13, P31, and P33 is completed through the above modes, the image sensor subsequently performs a binning operation on four green pixels P12, P14, P32 and P34, as in FIG. 2B.

Referring now to FIG. 2B, the binning operation on four green pixels P12, P14, P32 and P34 is described as follows.

In a fourth mode, the RD 120 may operationally activate all of the pixels P11~P14 located in the first row. The CDS input control unit 210 may turn on the first input switches SW12 and SW14 in even columns, the second input switches SW21 and SW22, and the third input switches SW32 and SW34 in the even columns.

Accordingly, green pixel signals in the first row may pass through the turned-on switches SW12/SW21/SW32 and SW14/SW22/SW34 to be supplied to the CDSs 132 and 134 located in the even columns. Accordingly, the CDSs 132 and 134 located in even columns may generate green sampling signals S_P12 and S_P14 according to the green pixel signals.

In a fifth mode, the RD 120 may activate all of the pixels P31~P34 located in the third row. The CDS input control unit 210 may turn on the first input switches SW12 and SW14 in the odd columns, the second input switches SW21 and SW22, and the third input switches SW31 and SW33 in odd columns.

Accordingly, in the fifth process mode green pixel signals in the third row may pass through the turned-on switches SW12/SW21/SW31 and SW14/SW22/SW33 to be supplied to the remaining CDSs 131 and 133 which have not performed the sampling operation in the fourth process mode, and in response to receiving the green pixel signals, the remaining CDSs 131 and 133 may generate green sampling signals S_P32 and S_P34.

In a sixth mode, the CDS output control unit 220 may turn on all of the output switches SW1~SW4.

Accordingly, when in the sixth mode, green sampling signals S_P12, S_P14, S_P32 and S_P34, generated through the plurality of CDSs 131~134, may be simultaneously supplied to the PGA 150, and the PGA 150 may perform a summation of these signals to thereby generate a final output signal.

Figure 3:
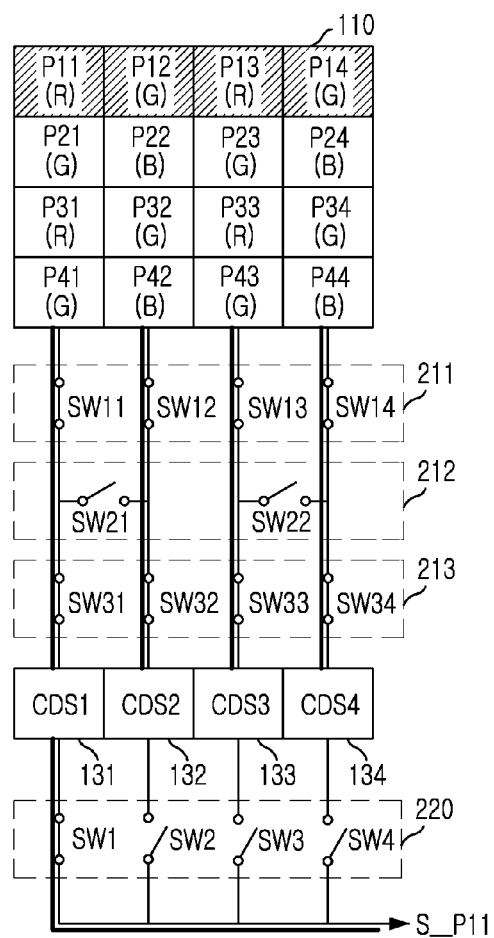
FIG. 3 is a diagram for explaining a normal operation of the image sensor according to an embodiment of the present invention.

FIG. 3 is a diagram for explaining a normal operation of the image sensor according to an embodiment of the present invention.

As illustrated in FIG. 3, the image sensor according to an embodiment of the present invention may connect the pixels P11~P14 and the CDSs 131~134, and the CDSs 131~134 and the PGA 150 during the normal operation.

That is, in a first mode of normal operation, the RD 120 may operationally activate the pixels P11~P14 located in a first row, and the CDS input control unit 210 may turn on the first input switches SW11 and SW13 and the third input switches SW31~SW34 while turning off the second input switches SW21~SW24.

Accordingly, in the first mode of normal operation, the pixels P11~P14 located in the first row and the plurality of CDSs 131~134 are connected in column units, such that all pixel signals generated by the pixels P11~P14 located in the first row may be supplied to the plurality of CDSs 131~134, and the plurality of CDSs 131~134 may perform correlated double sampling on the pixel signals to generate a plurality of sampling signals S_P11~S_P14.

In a second mode of normal operation, the CDS output control unit 220 may turn on the output switches SW1~SW4, one at a time. Accordingly, the PGA 150 may receive the sampling signals S_P11~S_P14 generated by the plurality of CDSs 131~134, one at a time, to perform programmable-gain amplification thereupon.

In this manner, the image sensor according to the embodiment of the present invention may actively vary the signal paths between the pixels and the CDSs, and CDSs and PGA, to thereby perform the summation (that is, binning operation) of the pixel signals, without varying the number or capacitances of capacitors included in the CDSs.

The image sensor may further include only switches having a relatively small size in order to perform the operation, whereby the image sensor may have a minimally increased size.

As set forth above, according to embodiments of the invention, there is provided an image sensor capable of performing a summation operation on pixel signals having a same color information, such that image improvement effects may be provided.

While the present invention has been shown and described in connection with the disclosed embodiments, it will be apparent to those skilled in the art that modifications and variations can be made to the presented embodiments without departing from the spirit and scope of the invention as defined by the appended claims.

What is claimed is:

1. An image sensor, comprising:
    an input control unit configured to control signal paths between a plurality of pixels and a plurality of sampling units and supplying outputs from the plurality of pixels in row units to the plurality of sampling units during a normal operation, while supplying the outputs from the plurality of pixels by color, to the plurality of sampling units during a binning operation; and
    an output control unit configured to control signal paths between the plurality of sampling units and an amplification unit and sequentially supplying outputs from the plurality of sampling units to the amplification unit during the normal operation while simultaneously supplying the outputs from the plurality of sampling units to the amplification unit during the binning operation,
    wherein the input control unit comprises an adjacent column connection unit having $N^2/2$ first switches, where N is a natural number equal to or greater than 2, the $N^2/2$ first switches having both terminals connected to output terminals of two pixels located in adjacent columns;
    and input switching unit having $N^2$ second switches connected between the both terminals of the $N^2/2$ first switches and input terminals of $N^2$ sampling units; and
    the output control unit comprises a pixel switching unit having $N^2$ third switches connected between output terminals of the $N^2$ sampling units and an input terminal of the amplification unit;
    wherein all of the $N^2/2$ first switches and the $N^2$ third switches are turned on and the $N^2$ second switches are alternately turned on in column units during the binning operation; and
    all of the $N^2/2$ first switches are turned off, all of the $N^2$ second switches are turned on, and the $N^2$ third switches are turned on one at a time, during the normal operation.

2. The image sensor of claim 1, wherein
    the adjacent column connection unit is configured to form a connection between pixels located in adjacent columns during the binning operation and releasing the connection of the pixels located in adjacent columns during the normal operation; and
    the input switching unit is configured to connect the pixels and sampling units located in a same column, and the pixels and sampling units located in adjacent columns during the binning operation, and connecting the pixels and sampling units in a same column during the normal operation.

3. The image sensor of claim 2, wherein the pixel switching unit selectively supplies pixel signals having the same color information among a plurality of pixel signals to the adjacent column connection unit during the binning operation, and supplying the plurality of pixel signals in row units to the adjacent column connection unit during the normal operation.

4. The image sensor of claim 1, wherein the amplification unit receives the outputs from the plurality of sampling units to perform a summation operation thereupon during the binning operation and receives an output from one of the plurality of sampling units to perform a programmable-gain amplification operation thereupon during the normal operation.

5. The image sensor of claim 1, wherein the plurality of sampling units receive outputs from $N^2$ pixels, where N is a natural number equal to or greater than 2, having the same color information during the binning operation.

6. A method comprising:
    configuring paths, by an output control unit and input control unit, so that an amplification unit receives outputs from a plurality of pixels in row units during a normal operation, and receives outputs from a plurality of pixels based on color during a binning operation; and
    performing, at the amplification unit, a summation operation during the binning operation and a programmable-gain amplification during the normal operation,
    wherein the input control unit comprises an adjacent column connection unit having $N^2/2$ first switches, where N is a natural number equal to or greater than 2, the $N^2/2$ first switches having both terminals connected to output terminals of two pixels located in adjacent columns;
    and input switching unit having $N^2$ second switches connected between the both terminals of the $N^2/2$ first switches and input terminals of $N^2$ sampling units; and
    the output control unit comprises a pixel switching unit having $N^2$ third switches connected between output terminals of the $N^2$ sampling units and an input terminal of the amplifier;
    wherein all of the $N^2/2$ first switches and $N^2$ third switches are turned on and the $N^2$ second switches are alternately turned on in column units during the binning operation; and,
    all of the $N^2/2$ first switches are turned off, all of the $N^2$ second switches are turned on, and the $N^2$ third switches are turned on one at a time, during the normal operation.

7. The method of claim 6, further comprising providing, by the input control unit, the output control unit with the output from the plurality of pixels during normal operation mode and binning operation mode.

8. The method of claim 7 further comprising configuring, by the input control unit, signal paths between the plurality of pixels and a plurality of sampling units, such that, outputs from the plurality of pixels are based on row units during the normal operation, and are based on color during the binning operation.

9. The method of claim 7, wherein the the adjacent column connection unit is configured to form a connection of pixels located in adjacent columns during the binning operation and releasing the connection during the normal operation; and the input switching unit is configured to connect the pixels and sampling units located in a same column, and the pixels and sampling units located in adjacent columns during the binning operation, and connecting the pixels and sampling units in a same column during the normal operation.

10. The method of claim 9, wherein pixel switching unit selectively supplies pixel signals having the same color information among a plurality of pixel signals to the adjacent column connection unit during the binning operation, and supplies the plurality of pixel signals in row units to the adjacent column connection unit during the normal operation.

11. The method of claim 9 further comprising receiving, at the plurality of sampling units, outputs from $N^2$ pixels, where N is a natural number equal to or greater than 2, having the same color information during the binning operation.

* * * * *